(12) United States Patent
Wilkinson et al.

(10) Patent No.: US 11,341,299 B2
(45) Date of Patent: May 24, 2022

(54) FLEXIBLE METHODS FOR GENERATION OF GNSS NAVIGATION DATA

(71) Applicant: Spirent Communications PLC, Crawley (GB)

(72) Inventors: John W. Wilkinson, Newton Abbot (GB); Mark Geoffrey Holbrow, Paignton (GB)

(73) Assignee: Spirent Communications PLC, Crawley (GB)

(*) Notice: Subject to any disclaimer, the term of this patent is extended or adjusted under 35 U.S.C. 154(b) by 115 days.

(21) Appl. No.: 16/776,461

(22) Filed: Jan. 29, 2020

(65) Prior Publication Data

US 2021/0232727 A1 Jul. 29, 2021

(51) Int. Cl.
*G06F 30/20* (2020.01)
*G06F 16/13* (2019.01)

(52) U.S. Cl.
CPC .............. *G06F 30/20* (2020.01); *G06F 16/13* (2019.01)

(58) Field of Classification Search
None
See application file for complete search history.

(56) References Cited

U.S. PATENT DOCUMENTS

2020/0192872 A1* 6/2020 Quinn .................. G06F 16/185
2021/0232727 A1* 7/2021 Wilkinson ............. G06F 30/20

OTHER PUBLICATIONS

"GSS9000 Series GNSS Simulation System", Spirent Communications, Inc., pp. 1-4, Aug. 2019.
GB 2005197.5 Preliminary Exam Report, dated May 6, 2020, 2 pages.
Zhao et al., "Multi-Constellation GNSS Signal Simulator and Its Software Implementation", 2009, pp. 422-428.
Martin et al., "Galileo Receiver Testing with the GNSS Signal Generator NSG 5100", 2008, pp. 982-989.
GB 2005197.5 Search Report, dated Jan. 11, 2021, 3 pages.
"SimSAFE GNSS Spoofing Simulation and Monitoring Simulation Tool for GNSS Threat Analysis and Mitigation Techniques", Spirent Communications, Inc, Oct. 2019, 2 pages.

(Continued)

*Primary Examiner* — Craig C Dorais
(74) *Attorney, Agent, or Firm* — Haynes Beffel & Wolfelf, LLP; Ernest J. Beffel, Jr.

(57) ABSTRACT

The disclosed technology teaches simulating new satellite messages for a GNSS simulation, providing a configuration file and programming script file, neither of which is pre-compiled into GNSS simulation code, that specify format for a message for a satellite and message format combination not yet operational or not yet compiled into the GNSS simulation code. Included is reading and applying the configuration file and running a script from the programming script file to generate navigation data for simulating positioning messages during the GNSS simulation and using the navigation data for simulating positioning signals during the GNSS simulation and testing of a GNSS receiver against the satellite and message format combination. The disclosed technology also teaches determining message format and values to use when simulating position signals by combining field format and field data values from a combination of the configuration files, almanac, ephemeris and related data, and the programming script files.

20 Claims, 8 Drawing Sheets

(56) References Cited

OTHER PUBLICATIONS

"SimGEN Software Suite for Spirent GNSS Constellation Simulation Systems", MS3008 Datasheet with Product Specification, Spirent Communications plc, GB, Jul. 2019, 41 pages.
"Spirent GSS9000 Series GNSS Simulation System", Datasheet with Product Specification MS9000 Issue 4-00 Provisional, Spirent Communications, plc, UK, Sep. 2019, 33 pages.

* cited by examiner

200

```
{
  "SVIDs" : [ 1, 2, 3, 4, 5, 6, 7, ... ],
  "alm_eph" : [
    {
      "svid" : 1,
      "galileo_time" : 642988800,
      "IODa" : 0,
      "IODnav" : 16,
      "tOc" : 86400,
      "af0" : 0.0,
      "af1" : 0.0,
      "af2" : 0.0,
      "eph_t0e" : 86400,
      "eph_Dn" : 0.0,
      ...
    },              ⟵ 224
    {
      "svid" : 2,
      "galileo_time" : 642988800,
      "IODa" : 0,
      "IODnav" : 16,
      ...
    },              ⟵ 234
    ...
  ]
}
```

```
{
  "A0" : {"size" : 32, "type" : "twos_complement", "scale_factor" : "2**-30", "units" : "s" },
  "alm_af0" : {"size" : 16, "type" : "twos_complement", "scale_factor" : "2**-19", "units" : "s" },
  "E5aDVS" : {"size" : 1, "type" : "bool" },
  "Spare" : {},
  "Tail" : {"size" : 6, "include_in_crc" : false},
  ...
}
```
                                         ⟵ 364

```
{
  "name": "F/NAV E5a page type 1", ———————— 415
  "fields": [
    { "name": "Type", "value": 1 }, ———————— 425
    { "name": "svid" },
    { "name": "IODnav" },
    { "name": "t0c" },
    { "name": "af0" },
    ...
    { "name": "E5aDVS" },
    { "name": "Spare", "size": 26 }, ———————— 445
    { "name": "CRC" },
    { "name": "Tail" }
  ],
  "total_size": 244
},
{
  "name": "F/NAV E5a page type 2", ———————— 455
  "fields": [
    { "name": "Type", "value": 2 },
    { "name": "IODnav" },
    { "name": "eph_M0" },
    ...
  ],
  ...
]
```

FIG. 4

```
from config_data import ConfigData                                    ─── 615
from posapp_data_reader.posapp_data import PosAppData
from utils.json_utils import JSONObject def _calc_page_to_generate(gal_time: int, svid: int, fnav_subframe_defns: 'JSONObject') \
        -> Optional[Tuple[int, int]]:                                 ─── 625
    """
    Calculates the pages to be generated at the given time for an SVID
    :param gal_time:
    :param svid:
    :param fnav_subframe_defns: JSON subframe definition object
    :return: subframe and page numbers tuple or None if no pages are to be generated at the given time
    """
    page_index = gal_nav.calc_page_index(gal_time, fnav_subframe_defns.page_duration,
                                          fnav_subframe_defns.pages_per_subframe, True)
    if page_index is not None:
        return _calc_frame_and_page_number_from_page_index(gal_time, svid, fnav_subframe_defns, page_index)
    return None

...

def _gen_nav_for_time_step(self, scen_time: ScenarioTime):            ─── 645
    frame_num = _calc_frame_number(scen_time, gal_time, self.config.fnav_subframe_defns)

for svid in self.posapp_data.svids:

if not self._is_signal_on(svid):
            continue subframe_and_page = _calc_page_to_generate(scen_time, gal_time, svid, self.config.fnav_subframe_defns)
        if subframe_and_page is None:
            continue subframe_id, page_to_generate = subframe_and_page page_defn = page_data.get_page_by_type(self.config.fnav_page_defns, page_to_generate)
        encoded_fields, bits = self.page_data.calc_page_data_and_bits(scen_time, gal_time, svid, frame_num, subframe_id,
                                                                      page_defn)
        bits = page_bits.add_crc(encoded_fields, bits)
        fec_bits = fec.encode(bits)
        interleaved_bits = sync_bits + self.interleave(fec_bits)

self.file_writer.output_page('F/NAV', scen_time, time_into_run, svid, encoded_fields, frame_num, subframe_id,
                                     page_to_generate, bits, fec_bits, interleaved_bits)
```

FIG. 6

```
def _calc_page_to_generate(gal_time: int, svid: int, page_duration: int, page_sequence: List[int],
                           page_overrides: "PageOverrides", on_even_seconds: bool) -> Optional[int]:
    """
    Calculates the INAV page to be generated at the given time
    :param gal_time:
    :param svid:
    :param page_duration: duration of page in seconds
    :param page_sequence: the standard sequence of pages to generate
    :param page_overrides: contains pages to transmit instead of the standard pages at specified times for specific
                           satellites
    :return: the page to generate or None if the given time does coincide with start of a page transmission
    :param on_even_seconds - true if the pages start on even number of seconds
    """
    page_index = gal_nav.calc_page_index(gal_time, page_duration, len(page_sequence), on_even_seconds)
    if page_index is None:
        return None
    override_page = page_overrides.get_page_override(gal_time, svid)
    if override_page is not None:
        return override_page
    return page_sequence[page_index]

class NavGenerator(gal_nav.NavGenerator):

def __init__(self, config: "ConfigData", posapp_data: "PosAppData", page_sequences: "JSONObject"):
        super().__init__(config, posapp_data)
        self.page_sequences = page_sequences
        self.alert_on_now = False
        self.alert_on_next = posapp_data.alerts.get_alert(posapp_data.gal_time_to + 1) is not None
        self.alert_type = 1
        posapp_data.intec_data.reset()
```

FLEXIBLE METHODS FOR GENERATION OF GNSS NAVIGATION DATA

FIELD OF THE TECHNOLOGY DISCLOSED

The technology disclosed relates generally to Global Navigation Satellite System (GNSS) simulators that replicate the signals produced by positioning satellite systems. Common GNSS systems are Global Positioning System (GPS), GLObal NAvigation Satellite System (GLONASS), Galileo, BeiDou Navigation Satellite System (BDS) and other regional systems. More specifically, the technology discloses flexible methods for generation of GNSS navigation data, for simulating new satellite signals for GNSS simulations.

BACKGROUND

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves may also correspond to implementations of the claimed technology.

A need exists for testing new GNSS message formats and satellite constellations. This need has existed for a long time and has not been addressed satisfactorily.

Global Navigation Satellite Systems (GNSS) have been a reality for more than forty years, starting with the Global Positioning System (GPS) deployed by the United States of America and followed by GLONASS deployed by the Russian Federation. New satellite constellations have been launched on a regional basis, in Japan (QZSS) and India (IRNSS). Constellations have been enhanced and expanded on a global basis, by the US (GPS), Russia (GLONASS), EU (Galileo), and China (BeiDou/COMPASS), as well as regional systems which are often known as RNSS rather than GNSS. Established satellite systems are undergoing modernization, with replenishment satellites carrying more and better signals. While these satellite systems have many similar characteristics, such as phase-modulated radio frequency signals that use coherent spread-spectrum and Code-Division Multiple Access (CDMA) techniques to share allocated transmission bandwidth, and with superimposed data messaging, the underlying detail of each system is often quite different.

When a satellite constellation is launched or substantially upgraded, there is an opportunity to introduce new transmission bands and message formats. Some transmission bands and message formats are generally and commercially used; others are restricted, such as for military use. A large installed base of receivers makes it difficult to implement new bands or message formats. Also, while the differences between new and old signals and between GNSSs may be relatively small, items such as the new data messages can entail significant programming to derive the appropriate content values and to fit that data content into the appropriate message slot with the required range and precision. Historically, due to the complexity of the data messages, the formatting is implemented using carefully written bespoke software code, which results in challenges when testing new GNSS message formats and satellite constellations, and in preparation of data messages for new and upgraded GNSS.

An opportunity arises for simulating new satellite messages for a GNSS simulation, and therefore significantly enhancing previously available test platforms. Potential consequences include enabling GNSS system developers to build and modify message designs without the need to edit and recompile tailor made software by the test equipment vendor, thus saving GNSS development and test time.

SUMMARY

A simplified summary is provided herein to help enable a basic or general understanding of various aspects of exemplary, non-limiting implementations that follow in the more detailed description and the accompanying drawings. This summary is not intended, however, as an extensive or exhaustive overview. Instead, the sole purpose of the summary is to present some concepts related to some exemplary non-limiting implementations in a simplified form as a prelude to the more detailed description of the various implementations that follow.

The disclosed technology teaches a method of simulating new satellite messages for a GNSS simulation, including providing a configuration file and a programming script file, neither of which is pre-compiled into a GNSS simulation code, that specify a format of at least one message (a message format) for a satellite and message format combination not yet operational or not yet compiled into the GNSS simulation code. In preparation for the GNSS simulation, the method includes reading and applying the configuration file and running a script from the programming script file to generate navigation data for simulating positioning messages during the GNSS simulation, and using the navigation data for simulating positioning signals during the GNSS simulation and testing of a GNSS receiver against the satellite and message format combination not yet operational or net yet compiled into the GNSS simulation code.

Other aspects and advantages of the technology disclosed can be seen on review of the drawings, the detailed description and the claims, which follow.

BRIEF DESCRIPTION OF THE DRAWINGS

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings.

FIG. 2 shows a snippet of the structure of almanac, ephemeris and related data which contains the navigation data field values.

FIG. 3 shows an example snippet of a configuration file which defines the structure of the navigation data.

FIG. 4 shows an example configuration file snippet of pages definitions in which each page has a name and a list of fields.

FIG. 6 shows a programming script file example, with three code excerpts of an F/NAV program script for calculating which page to generate when and which satellite's almanac is to be transmitted in which page.

FIG. 7 is a second programming script file example, with a code excerpt from an I/NAV module script that contains code used to generate I/NAV E1-B and I/NAV E5b data.

DETAILED DESCRIPTION

Figure 1:
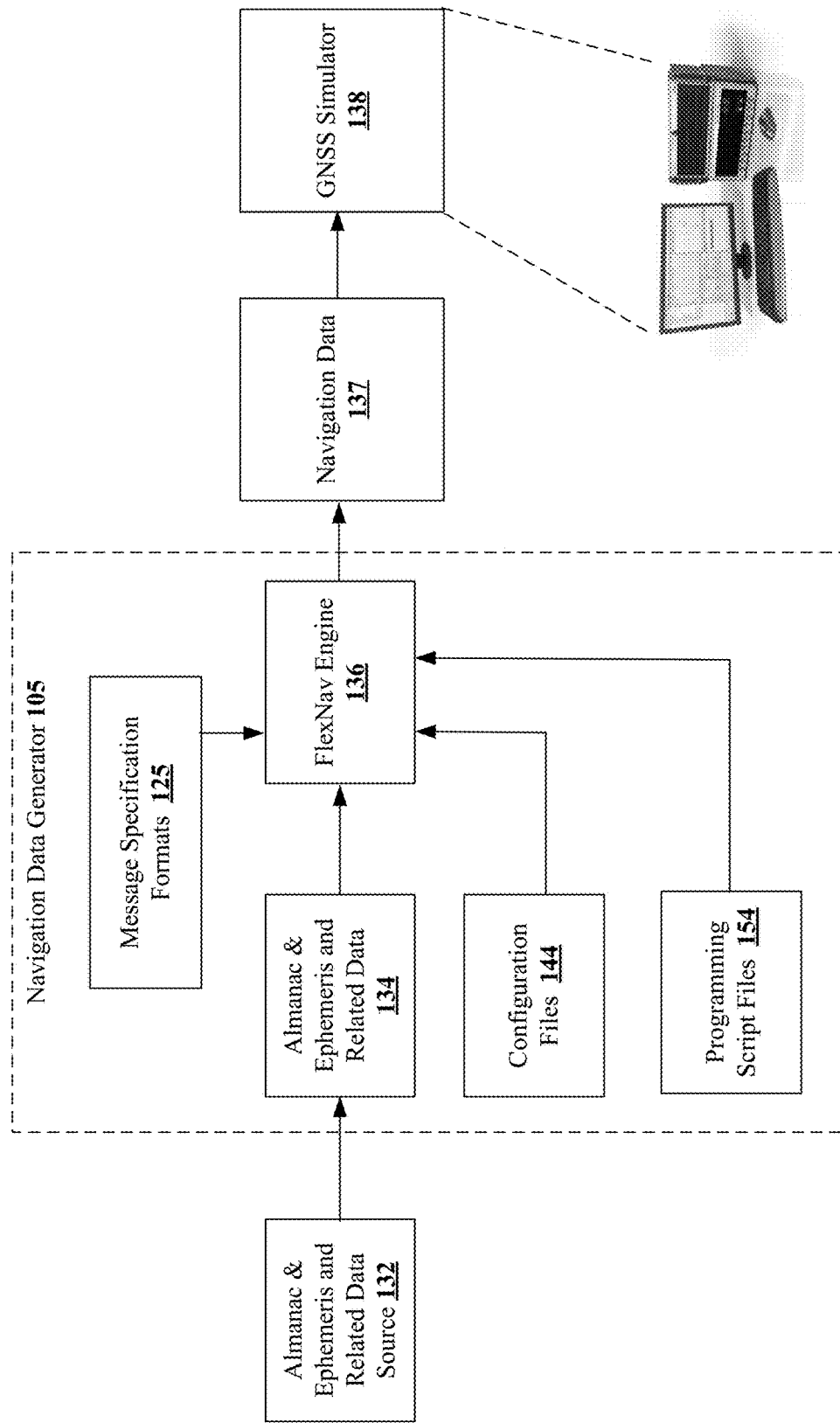
FIG. 1 depicts an exemplary system for simulating new satellite signals for a GNSS simulation, according to one implementation of the technology disclosed.

The following detailed description is made with reference to the figures. Sample implementations are described to illustrate the technology disclosed, not to limit its scope, which is defined by the claims. Those of ordinary skill in the art will recognize a variety of equivalent variations on the description that follows.

GNSS simulators replicate the signals produced by positioning satellite systems such as GPS. These simulators need to generate the data messages transmitted by the satellites. This data is termed "navigation data". Navigation data are generally hardcoded in the simulator software executables, which, in turn, generate the messages conveyed. The navigation data includes the format of messages that are used to deliver, among other things, updated almanac, ephemeris and related data. New message formats require updated interface control documents (ICDs). Example types of messages, some of which a satellite developer or tester may need to customize, are described next.

In one example, the Galileo satellites broadcast five types of data in four navigation messages: the Freely accessible Navigation Message (F/NAV) and Integrity Navigation Message (I/NAV), the Commercial Navigation Message (C/NAV) and the Governmental Navigation Message (G/NAV). The Galileo satellites can typically offer several types of services with different purposes and to suit the needs of different types of users. The Integrity data will provide time-alarms and parameters to compute the integrity risk to support Safety-of-Life applications. The Supplementary data is expected to provide information to support different envisaged commercial services as differential corrections for High Precision Positioning Service, and different kind of information data as weather alerts, traffic information. The data is encrypted to control the access to authorized users by the service providers. The Public Regulated data is under governmental control and it is devoted to the Public Regulated Service (PRS). The system will guarantee a high continuity of service with controlled access by encryption of data. The Search and Rescue data will provide the capability to send acknowledgment SAR (Search and Rescue) messages to a Beacon equipped with a suitable GNSS receiver.

The historical approach for provisioning new and emerging signals and systems has been to await the availability of the appropriate interface control document (ICD), the definition document of the signaling and constellation characteristics. In the past, message formats have been compiled into test equipment by test equipment providers. Modifying message formats has involved recoding test generators and recompiling code.

The technology disclosed puts testing of alternative message formats in the hands of GNSS constellation developers, such as the European Space Agency or the UK Space Agency. The disclosed technology adds to any compiled message formats built into test equipment, an opportunity to specify message formats and values to be used during testing, in standalone files, in one or more of a configuration file, an almanac and ephemeris file and a script file. Features of the technology disclosed include a new message specification format and test equipment enabled to process custom formats. Extending customization of message formats and values for test purposes from a test equipment vendor to constellation developers significantly enhances previously available test platforms.

A combination of a configuration file, an almanac and ephemeris file and a script file can be used to specify values to be used in messages during a test. Fixed values, such as satellite identifiers, can be specified in a configuration file. For instance, they can be part of a field definition. Some fields can be generated from almanac and ephemeris values. These values can be compiled into test equipment, for operational constellations with known characteristics. Or, they can be calculated from values held in an almanac and ephemeris file. A clear text almanac and ephemeris file with standard parameters can be compiled using Applicant's test equipment, by a competing test vendor, or by a constellation developer, prior to satellite launch. A clear text almanac and ephemeris file can be edited using simple tools to inject errors that might be encountered by a receiver, either due to noise or jamming. Values for message fields that are not fixed and not derived from almanac, ephemeris and related data can be populated using scripts. The test equipment developer can supply some scripts, including modifiable scripts. The constellation developer can edit supplied scripts and can devise entirely new scripts. These sources of values for messages can be combined in several ways, giving precedence to sources of values in an order that gives highest precedence to the configuration file or to the script file.

Using the technology disclosed simplifies simulation testing of new message formats and satellite constellations. It enhances the control that constellation developers have over tests, without requiring recompilation of simulation software provided by a test equipment developer. Next, we describe an example architecture for simulating new satellite signals for a GNSS simulation.

Architecture

FIG. 1 shows example architecture 100 for simulating new satellite signals for a GNSS simulation. As context, satellite constellation simulators are routinely used to test GNSS receivers in the laboratory or for manufacturing test purposes without having to use actual satellite signals. Actual satellite signals are subject to variation and interference whereas satellite constellation simulators offer inherently stable, controllable and repeatable test environments. These can be used with existing signal definitions for receivers that are to be sold commercially and can also be used with signals and systems that are still in the development phase and that are yet to be deployed.

Architecture 100 includes almanac, ephemeris and related data source 132 that provides almanac, ephemeris and related data 134. Almanac and ephemeris and related data source 132 uses a data file generator supplied with the GNSS simulation code in one implementation. Almanac, ephemeris and related data source 132 uses software of a user's choice, not supplied with the GNSS simulation code, in another implementation. The almanac, ephemeris and related data are represented in clear text that is editable using a text editor.

Ephemerides are highly precise orbital definitions and data that are uploaded and updated regularly from the ground to the satellite, relating to that individual satellite, and that are modulated onto the signal, and that are repeated frequently and regularly. This information allows the receiver to calculate accurately the satellite's location at the time when its synchronous transmission was started. Knowledge of the satellite's location at this time allows the receiver to calculate the time delay and hence distance to the satellite plus the geometry that is in turn used to calculate receiver location. Ephemerides also contain basic quality data concerning the on-board satellite reference clock which can be used to remove its uncertainty from the calculations of range. Ephemerides contain static fields, such as identification flags and health flags, as well as incrementing fields to help resolve timing uncertainties and ambiguities.

Almanac data is similar to ephemerides and with similar content but containing reduced-precision and reduced-scope orbital definitions and data that are uploaded and updated less frequently than ephemerides, relating to all the satellites in the constellation, and sometimes concerning other constellations, and that are modulated onto the signal, and repeated less frequently but regularly. This information allows the receiver to make quick calculations relating to other satellite locations and to determine which may be in view, hence reducing the time taken to acquire the signal using this a-priori information to narrow the search. Related data includes ionospheric conditions, which are usually coefficients of a model that can be used by the receiver to partially correct for signal delays through the Ionosphere. Additional related data includes Cyclic Redundancy Check fields which can be used to correct data bits that are received incorrectly and parity fields that can be used to detect errors in received data.

Almanac, ephemeris and related data source 132 is a software program that generates the raw data that needs to be formatted into navigation data in one implementation. The raw data includes satellite almanac, ephemeris and related data such as the satellite orbits. In one implementation, the software program is positioning app (PosApp); a different program can be used to generate the raw data in another implementation. In another case, almanac, ephemeris and related data 134 can be data that was stored and is loaded from memory when needed.

In one test case, the almanac, ephemeris and related data file is modified by a user to introduce errors prior to using the almanac, ephemeris and related data file to generate the navigation data for simulating positioning signals.

Continuing the description of FIG. 1, architecture 100 also includes navigation data generator 105 that includes FlexNav engine 136, message specification formats 125, almanac, ephemeris and related data 134, configuration files 144 and programming script files 154. FlexNav engine 136 reads almanac, ephemeris and related data 134 as raw data and formats it as defined by message specification formats 125, in preparation for the GNSS simulation. FlexNav engine 136 also reads configuration files 144 and runs a script from programming script files 154 to generate navigation data 137 for simulating positioning signals during GNSS simulation and perform actions such as CRC calculation that cannot be easily specified by configuration files. Configuration files 144 are expressed in clear text that is editable using a text editor. Configuration files 144 and programming script files 154 are not pre-compiled into the GNSS simulation code that specifies satellite orbit and message format data for a satellite and message format combination that is not yet operational.

In one case, the satellite and message format combination specified in the configuration file and the programming script file is not yet operational because the satellite is not yet operational. In another case, the satellite and message format combination specified in the configuration file and the programming script file is not yet operational because the message format specified is not yet operational.

Continuing further the description of FIG. 1, architecture 100 also includes GNSS simulator 138 which uses generated navigation data 137 for simulating positioning signals during the simulating and testing of a GNSS receiver against the satellite and signal combination not yet operational or net yet compiled into the GNSS simulation code. Despite detailed data message formats of the various GNSS or satellite constellation simulator systems being substantially different, their underlying content is often similar. GNSS simulator 138 utilizes resultant navigation data 137, enabling GNSS designers and testers correctly populate the message fields with this data in accordance with the ICD without having to write specific and bespoke software code. Note that ICDs can be changed and updated on a regular basis, sometimes multiple times per year, so the disclosed technology makes it much easier to maintain and change navigation data as the ICDs change. In one example, the UI Ministry of Defense may want to develop their own space defense program if and when Brexit is complete. In that case, they will decide on signal structure as they develop their own GNSS.

FIG. 2 shows an example snippet 200 of the structure of almanac, ephemeris and related data 134, which contains the navigation data field values. The almanac, ephemeris and related data 134 contains the raw data for each satellite for which navigation data is to be generated. Snippet 200 shows a subset of the fields and values for satellites svid 1 224 and svid 2 234.

FIG. 3 shows an example snippet of a configuration file 300, that defines the structure of the navigation data. Configuration files generally consist of a set of records, termed "pages", with each page containing several fields, and the files are expressed in clear text that is editable using a text editor. Fields hold data values. Configuration file 300 shows one way that fields can be defined in a configuration file. In this example JSON is used. Another implementation of the disclosed technology can use a different preferred format. Each field needs at least a name and type, and typically a size. This field definition file contains the information needed by FlexNav engine 136 to encode field values; that is, to encode a field's numeric value to the correct string of bits. Note that the data items in almanac, ephemeris and related data 134 shown in snippet 200 and the fields in configuration file 300 have the same names. This "name" link between the two files allows field values to be obtained.

FIG. 4 shows an example configuration file snippet 400 of pages definitions. Each page has a name and a list of fields. In this example, one page has the name "F/NAV E5a page type 1" 415 and another page has the name "F/NAV E5a page type two" 455. Field sizes can be specified using a "size" tag, as shown for "spare" field 445. In the example configuration file snippet 400 of pages definitions, the order of fields in the JSON definition defines the order of fields in the navigation data. In another example, order can be specified via envisages, for example by an "order" tag. Also, field values can be hardcoded using "value" tag, as per the "Type" fields in FIG. 3. Additional configuration files can be used, for example to define the order in which pages are generated.

Historically, navigation data formats are hardcoded into compiled software executables and users cannot modify these, as they do not generally have access to the program source code or build systems. In contrast, the disclosed new method of simulating new satellite signals for GNSS simulation is flexible, allowing test equipment designers and users of the test equipment to create non-standard message formats, by modifying configuration files or by modifying programming script files 154.

Figure 5:
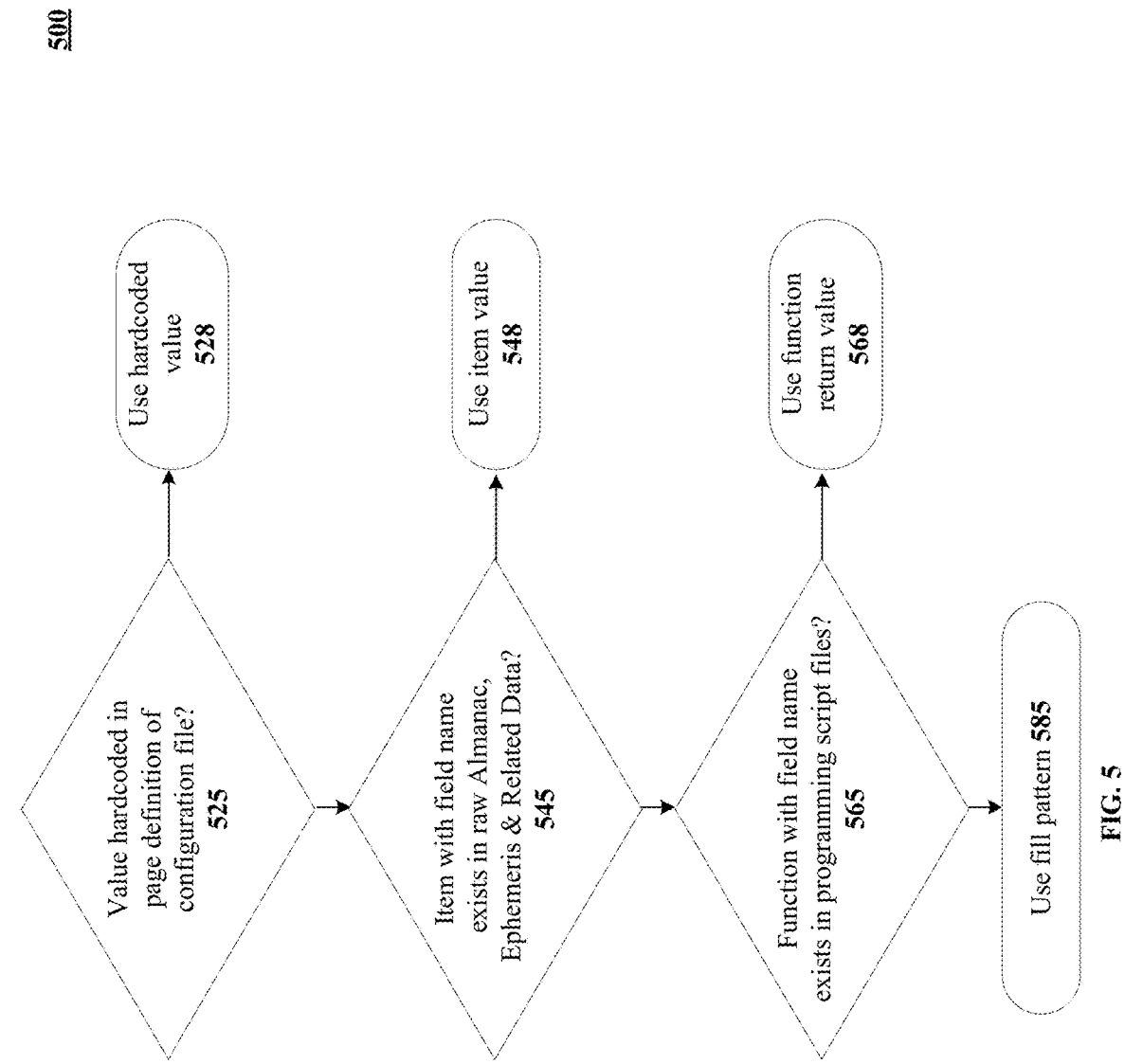
FIG. 5 illustrates the data value determination procedure for determining the message format and the navigation data to use for simulating position signals by combining field format and field data values from a combination of the configuration file, almanac, ephemeris and related data, and the programming script file.

FIG. 5 illustrates the data value determination procedure 500 for determining the message format and the navigation data to use for simulating position signals by combining field format and field data values from a combination of the configuration file, almanac, ephemeris and data, and the programming script file. When FlexNav engine 136 runs and is generating navigation data 137 for a satellite it needs to obtain field data values at each time step, determining field formats from the configuration file and determining values with which to populate fields in the field formats determined from the configuration file. These field data values are obtained in accordance with procedure 500. The first step uses a field value specification in the configuration file with the field formats, considering whether the value is hardcoded in the page definition 525. If yes, then FlexNav engine 136 uses that hardcoded value 528. For example, the "Type" field in configuration file snippet 400 of pages definitions has a "value" tag 425 in the page definition for page type 1 415, so that value will be used. If there is not a field value specification in the configuration file, there is no "value" tag, and this results in the field name being used as a key to generate a value from the raw almanac, ephemeris and related data. That is, the second step considers whether an item with the field name in question exists in raw almanac, ephemeris and related data 545, and if yes uses that item value 548. The third step 565 of the field value determination procedure considers whether a function with the field name exists in programming script files 154 for FlexNav engine 136, for the scenario in which there is not a field value specification in the configuration file and for which there is not a field value specification in the almanac, ephemeris and related data with which to generate the values. This is the situation in which the value is not hardcoded in the page definition and there is no such field in the raw almanac, ephemeris and related data 134. In this third step 565, FlexNav engine 136 identifies a script in programming script files 154 and uses the identified script to generate the values, obtaining the data value from a script function having the same name as the field name. If there is no such function, the field is filled with a fill pattern 585; in one example the fill pattern is a sequence of 0s and 1s.

An example of such a script function, which simply returns an incrementing index, is shown next. Python is used in the example, but any similar language could be used instead. The function returns the data for a Page field named "E5aDVS". This is a simple function, but the function could be of any complexity. This example function does not use the time and svid parameters, but such parameters would often be needed to calculate the required value.

```
def E5aDVS(time, svid):
    E5aDVS.count+=1
    return E5aDVS.count
E5aDVS.count=0
```

Configuration files define the static part of the ICD, that is, the page formats. Parts of the ICD that are algorithmic, such as cyclic redundancy check (CRC) calculations used to correct data bits that are received incorrectly and parity fields usable to detect errors in received data, are implemented in a scripting language such as Python. The disclosed technology enables end users to define non-standard navigation data by editing the configuration files or by using minimal programming knowledge for modifying the program scripts.

In one example, Galileo satellites broadcast messages that include messages named Freely Accessible Navigation Message (F/NAV) and Integrity Navigation Message (I/NAV), as described at https://gssc.esa.int/navipedia/index.php/Galileo_Navigation_Message, accessed on Jan. 15, 2020. The satellites offer multiple types of services with different purposes and to suit the needs of different types of users. Next, we describe two programming script files 154, written in Python language, for generating F/NAV and I/NAV messages, respectively.

FIG. 6 shows three code excerpts from a much longer an example F/NAV program script for calculating which page to generate when and which satellite's almanac is to be transmitted in which page. The first code snippet lists code that imports ConfigData from configuration files 144 and PosAppData, from an almanac, ephemeris and related data 615 source, such as data generated by SimGen software. The second code snippet defines a function named "_calc_page_to_generate" that calculates the pages to be generated, based on a time input and an SVID 625 input. The third code snippet defines a function named "_gen_nav_for_time_step" that outputs an F/NAV page based on an input ScenarioTime 645.

FIG. 7 shows a code excerpt from a much longer n I/NAV module script that contains code used to generate I/NAV E1-B and I/NAV E5b data. This I/NAV script generates "words", which like pages are composed of fields and are themselves then inserted into pages. In addition, alerts cause normal pages to be replaced by special alert pages. The code snippet shown in FIG. 7 is the beginning of the definition of the function for calculating which page to generate 715. A satellite designer or tester can use the disclosed technology to customize the scripts they need. A different software language can be utilized in another implementation. Next, we describe a computer system usable for simulating new satellite signals for a GNSS simulation and for determining the message format and values to use when simulating position signals.

Workflow

Figure 8:
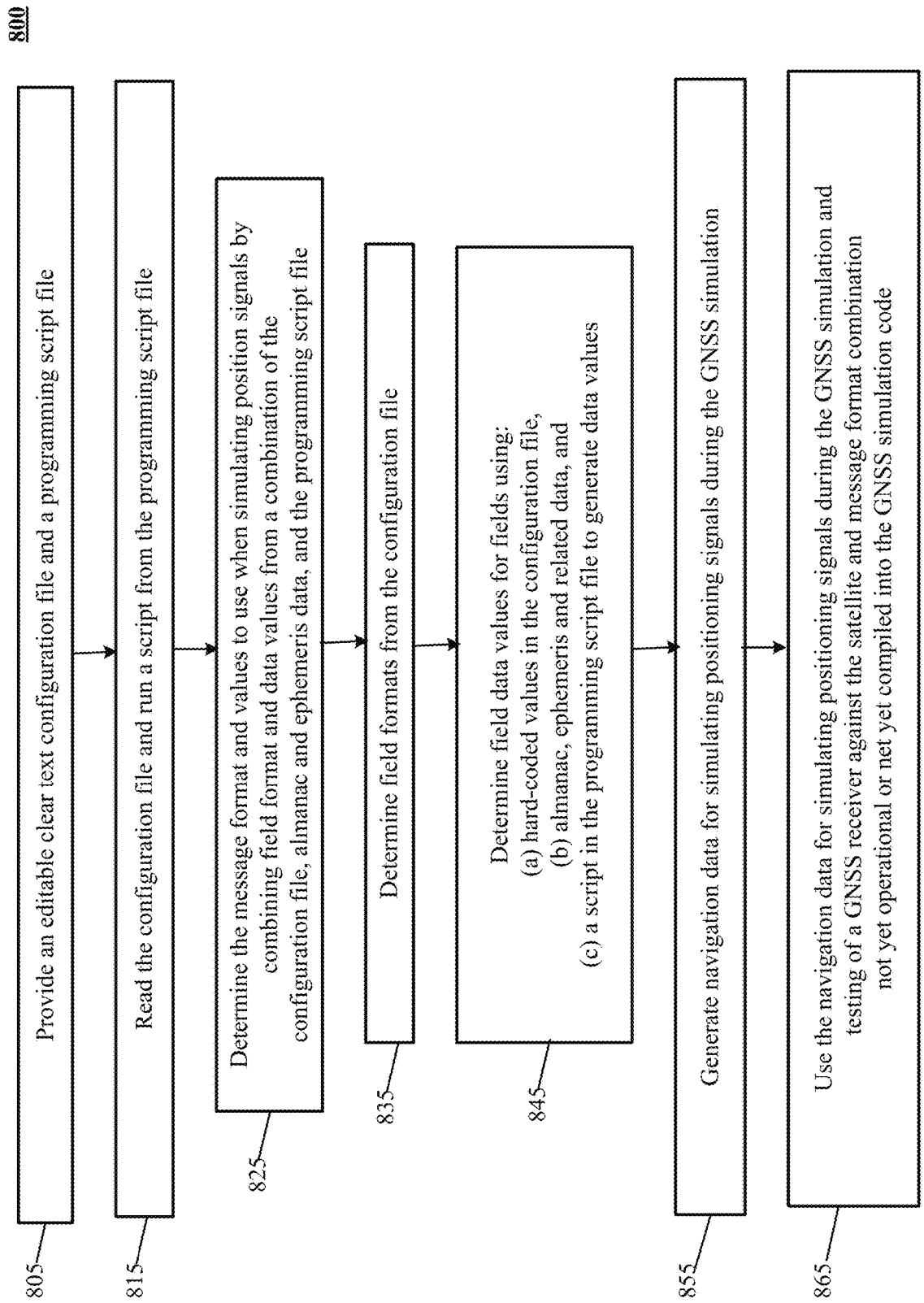
FIG. 8 shows a representative workflow for simulating new satellite signals for a GNSS simulation and for determining the message format and the navigation data to use for simulating position signals.

FIG. 8 shows a representative method of simulating new satellite signals for a GNSS simulation and for determining the message format and values to use when simulating position signals—by combining field format and field data values from a combination of the configuration file, almanac, ephemeris and related data, and the programming script file. Flowchart 800 can be implemented at least partially with a computer or other data processing system; that is, by one or more processors configured to receive or retrieve information, process the information, store results, and transmit the results. Other implementations may perform the actions in different orders and/or with different, fewer or additional actions than those illustrated in FIG. 8. Multiple actions can be combined in some implementations. For convenience, this flowchart is described with reference to a Spirent controller.

The method described in this section and other sections of the technology disclosed can include one or more of the following features and/or features described in connection with additional methods disclosed. In the interest of conciseness, the combinations of features disclosed in this application are not individually enumerated and are not repeated with each base set of features.

FIG. 8 begins with action 805 providing a configuration file and a programming script file, neither of which is pre-compiled into a GNSS simulation code, that specify a format for at least one message (a message format) for a satellite and message format combination not yet operational or not yet compiled into the GNSS simulation code.

Process 800 continues at action 815 with reading the configuration file and running a script from the programming script file to generate navigation data for simulating positioning signals during the GNSS simulation.

The process continues at action 825 with determining the message format and the navigation data to use for simulating position signals by combining field format and field data values from a combination of the configuration file, almanac, ephemeris and related data, and the programming script file.

Action 835 includes determining field formats from the configuration file.

Process 800 action 845 is determining values with which to populate fields in the field formats determined from the configuration file, including for at least a first field, using a field value specification in the configuration file with the field formats, for at least a second field for which there is not a field value specification in the configuration file, using the almanac, ephemeris and related data to generate the values, and for at a least third field for which there is not a field value specification in the configuration file and for which the almanac, ephemeris and related data are not sufficient to generate the values, identifying a script in the programming script file and using the identified script to generate the values.

Action 855 includes generating navigation data for simulating positioning signals during the GNSS simulation.

Action 865 is using the navigation data for simulating positioning signals during the GNSS simulation and testing of a GNSS receiver against the satellite and signal combination not yet operational or net yet compiled into the GNSS simulation code.

Other implementations may perform the actions in different orders and/or with different, fewer or additional actions than those illustrated in FIG. 8. Multiple actions can be combined in some implementations. For convenience, this flowchart is described with reference to the system that carries out a method. The system is not necessarily part of the method.

A different representative method utilizes actions for automated testing a connection between a first location and a second location through a counterpart location, to establish a test of audio communications between first and second locations through a counterpart location, utilizing the disclosed audio cross-over cable. Example actions will readily occur to those skilled in the art. A block diagram of a computer system usable for testing a connection between a subscriber and a location with which the subscriber is having problems is described.

Computer System

Figure 9:
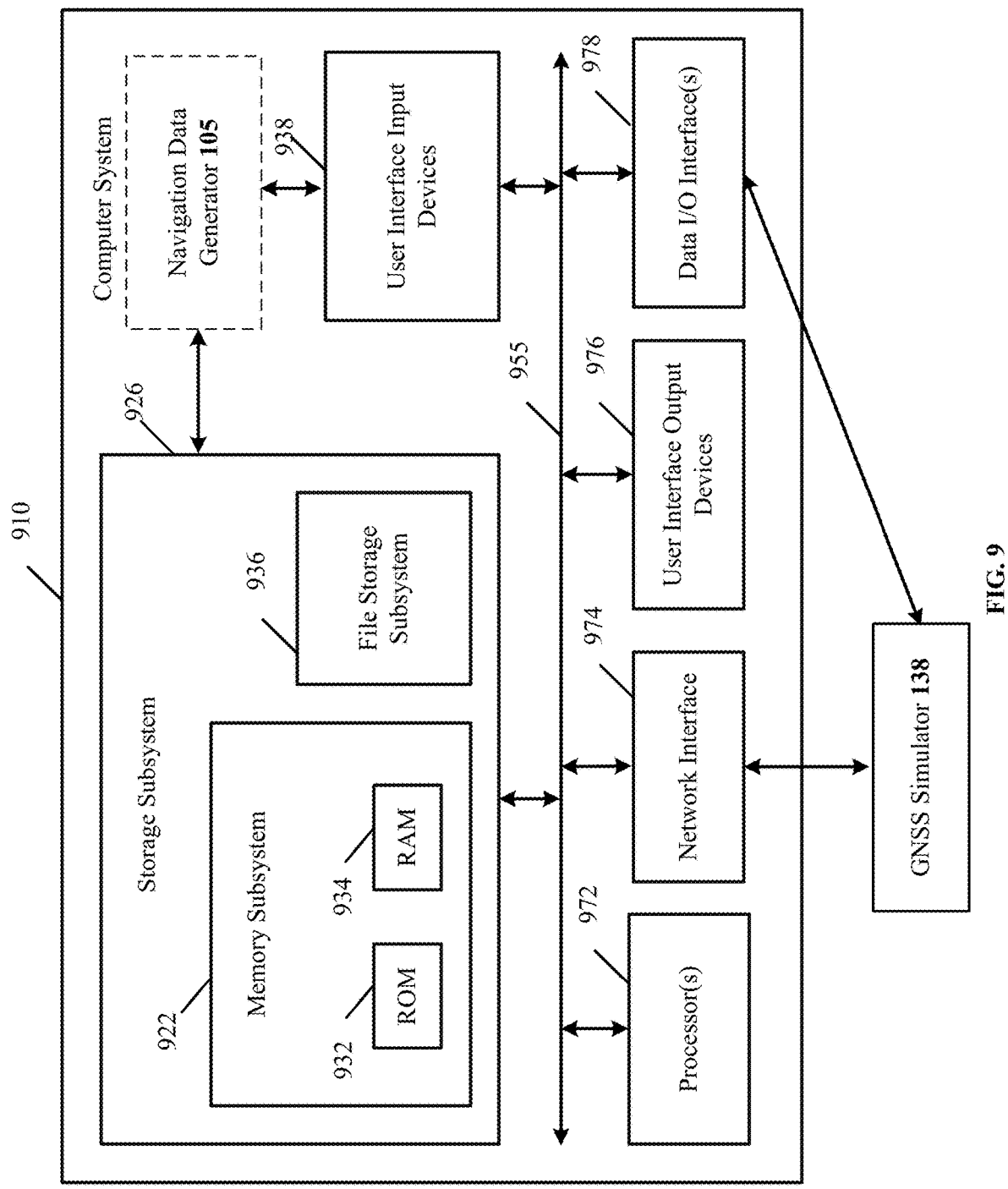
FIG. 9 depicts a block diagram of an exemplary system for simulating new satellite signals for a GNSS simulation and for determining the message format and values to use when simulating position signals by combining field format and field data values from a combination of the configuration file, almanac, ephemeris and related data, and the programming script file, according to one implementation of the technology disclosed.

FIG. 9 is a simplified block diagram of a computer system 910 that can be used for simulating new satellite signals for a GNSS simulation. Computer system 910 can also be used for determining the message format and the navigation data to use for simulating position signals by combining field format and field data values from a combination of the configuration file, almanac, ephemeris and related data, and the programming script file, according to one implementation of the technology disclosed.

Computer system 900 includes at least one central processing unit (CPU) 972 with navigation data generator 105 that communicates with a number of peripheral devices via bus subsystem 955. These peripheral devices can include a storage subsystem 926 including, for example, memory devices and a file storage subsystem 936, user interface input devices 938, user interface output devices 976, and a network interface subsystem 974. The input and output devices allow user interaction with computer system 900. Network interface subsystem 974 provides an interface to a communication network 984, and to corresponding interface devices in other computer systems.

In one implementation, the GNSS simulator 138 of FIG. 1 is communicably linked to the storage subsystem 926 and the user interface input devices 938 through network interface 974. User interface input devices 938 can include a keyboard; pointing devices such as a mouse, trackball, touchpad, or graphics tablet; a scanner; a touch screen incorporated into the display; audio input devices such as voice recognition systems and microphones; and other types of input devices. In general, use of the term "input device" is intended to include all possible types of devices and ways to input information into computer system 900.

User interface output devices 976 can include a display subsystem, a printer, a fax machine, or non-visual displays such as audio output devices. The display subsystem can include an LED display, a flat-panel device such as a liquid crystal display (LCD), a projection device, a cathode ray tube (CRT), or some other mechanism for creating a visible image. The display subsystem can also provide a non-visual display such as audio output devices. In general, use of the term "output device" is intended to include all possible types of devices and ways to output information from computer system 900 to the user or to another machine or computer system.

Storage subsystem 926 stores programming and data constructs that provide the functionality of some or all of the modules and methods described herein.

Memory subsystem 922 used in the storage subsystem 910 can include a number of memories including a main random access memory (RAM) 932 for storage of instructions and data during program execution and a read only memory (ROM) 934 in which fixed instructions are stored. A file storage subsystem 936 can provide persistent storage for program and data files, and can include a hard disk drive, a floppy disk drive along with associated removable media, a CD-ROM drive, an optical drive, or removable media cartridges. The modules implementing the functionality of certain implementations can be stored by file storage subsystem 936 in the memory subsystem 922, or in other machines accessible by the processor.

Bus subsystem 955 provides a mechanism for letting the various components and subsystems of computer system 900 communicate with each other as intended. Although bus subsystem 955 is shown schematically as a single bus, alternative implementations of the bus subsystem can use multiple busses.

Computer system 900 itself can be of varying types including a personal computer, a portable computer, a workstation, a computer terminal, a network computer, a television, a mainframe, a server farm, a widely-distributed set of loosely networked computers, or any other data processing system or user device. Due to the ever-changing nature of computers and networks, the description of computer system 900 depicted in FIG. 9 is intended only as a specific example for purposes of illustrating the preferred embodiments of the present invention. Many other configurations of computer system 900 are possible having more or less components than the computer system depicted in FIG. 9.

The preceding description is presented to enable the making and use of the technology disclosed. Various modifications to the disclosed implementations will be apparent, and the general principles defined herein may be applied to other implementations and applications without departing from the spirit and scope of the technology disclosed. Thus, the technology disclosed is not intended to be limited to the implementations shown but is to be accorded the widest scope consistent with the principles and features disclosed herein. The scope of the technology disclosed is defined by the appended claims.

Some Particular Implementations

Some particular implementations and features are described in the following discussion.

In one implementation, a disclosed method of simulating new satellite signals for a Global Navigation Satellite System (GNSS) simulation includes providing a configuration file and a programming script file, neither of which is pre-compiled into a GNSS simulation code, that specify satellite a format of at least one message (a message format) for a satellite and message format combination not yet operational or not yet compiled into the GNSS simulation code. The method also includes, in preparation for the GNSS simulation, reading and applying the configuration file and running a script from the programming script file to generate navigation data for simulating positioning messages during the GNSS simulation, and using the navigation data for simulating positioning signals during the GNSS simulation and testing of a GNSS receiver against the satellite and message format combination not yet operational or net yet compiled into the GNSS simulation code. The configuration file and a programming script file, neither of which is pre-compiled into a GNSS simulation code, specify satellite orbit, in some implementations.

This method and other implementations of the technology disclosed can include one or more of the following features and/or features described in connection with additional methods disclosed. In the interest of conciseness, the combinations of features disclosed in this application are not individually enumerated and are not repeated with each base set of features.

For some implementations of the disclosed method, the configuration file is in clear text that is editable using a text editor.

For some implementations of the disclosed method, the satellite and message format combination specified in the configuration file and the programming script file is not yet operational because the satellite is not yet operational. For other implementations, the satellite and message format combination specified in the configuration file and the programming script file is not yet operational because the message format specified is not yet operational.

For one implementation of the disclosed method, the satellite and message format combination specified in the configuration file and the programming script file is not yet compiled into the GNSS simulation code.

Some implementations of the disclosed method also include determining the message format and values to use when simulating position signals by combining field format and field data values from a combination of the configuration file, almanac, ephemeris and related data, and the programming script file, including determining fields and field formats from the configuration file and determining values with which to populate the fields. The method includes for at least a first field, using a field value specification from the configuration file, for at least a second field for which there is not a field value specification in the configuration file, using at least the almanac, ephemeris and related data to generate the values, and for at a least third field for which there is not a field value specification in the configuration file and for which the almanac, ephemeris and related data are not sufficient to generate the values, identifying a script in the programming script file and using the identified script to generate the values.

Another implementation of a disclosed method further includes providing an almanac, ephemeris and related data file in clear text that is editable using a text editor and reading the almanac, ephemeris and related data file to generate navigation data for simulating positioning messages during the GNSS simulation.

For some implementations of the disclosed method, the almanac, ephemeris and related data file is generated using a data file generator supplied with the GNSS simulation code. For others, the almanac, ephemeris and related data file is generated using software of a user's choice, not supplied with the GNSS simulation code. In one implementation, the almanac, ephemeris and related data file can be modified by a user to introduce errors prior to using the almanac, ephemeris and related data file to generate the navigation data for simulating positioning signals. For some implementations, the almanac, ephemeris and related data file describes that satellite that is not yet operational. For other implementations, the almanac, ephemeris and related data file describes that satellite that is not yet compiled into the GNSS simulation code.

In another implementation, a disclosed system includes one or more processors coupled to memory, the memory loaded with computer instructions, when executed on the processors, implement any of the disclosed methods.

In yet another implementation a disclosed tangible non-transitory computer readable storage media is impressed with computer program instructions that, when executed on a processor, implement any of the disclosed methods.

The technology disclosed can be practiced as a system, method, or article of manufacture. One or more features of an implementation can be combined with the base implementation. Implementations that are not mutually exclusive are taught to be combinable. One or more features of an implementation can be combined with other implementations.

While the technology disclosed is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the innovation and the scope of the following claims.

We claim as follows:

1. A method of simulating new satellite messages for a Global Navigation Satellite System (abbreviated GNSS) simulation, including:

providing a configuration file and a programming script file, neither of which is pre-compiled into a GNSS simulation code, that specify a format of at least one message (a message format) for a satellite and message format combination not yet operational or not yet compiled into the GNSS simulation code;

in preparation for the GNSS simulation, reading and applying the configuration file and running a script from the programming script file to generate navigation data for simulating positioning messages during the GNSS simulation; and using the navigation data for simulating positioning signals during the GNSS simulation and testing of a GNSS receiver against the satellite and message format combination not yet operational or net yet compiled into the GNSS simulation code.

2. The method of claim 1, wherein the configuration file is in clear text that is editable using a text editor.

3. The method of claim 1, wherein the satellite and message format combination specified in the configuration file and the programming script file is not yet operational because the satellite is not yet operational.

4. The method of claim 1, wherein the satellite and message format combination specified in the configuration file and the programming script file is not yet operational because the message format specified is not yet operational.

5. The method of claim 1, wherein the satellite and message format combination specified in the configuration file and the programming script file is not yet compiled into the GNSS simulation code.

6. The method of claim 1, further including determining the message format and values to use when simulating position signals by combining field format and field data values from a combination of the configuration file, almanac, ephemeris and related data, and the programming script file, including:

determining fields and field formats from the configuration file; and determining values with which to populate the fields, including:

for at least a first field, using a field value specification from the configuration file, for at least a second field, for which there is not a field value specification in the configuration file, using at least almanac and ephemeris data to generate the values, and for at a least third field, for which there is not a field value specification in the configuration file and for which the almanac and ephemeris data are not sufficient to generate the values, identifying a script in the programming script file and using the identified script to generate the values.

7. The method of claim 1, further including providing a data file including at least almanac and ephemeris data in clear text that is editable using a text editor and reading the almanac and ephemeris data file to generate navigation data for simulating positioning messages during the GNSS simulation.

8. The method of claim 7, wherein the almanac and ephemeris data file is modified by a user to introduce errors prior to using the almanac and ephemeris data file to generate the navigation data for simulating positioning signals.

9. The method of claim 7, wherein the almanac and ephemeris data file describes that satellite that is not yet operational.

10. The method of claim 7, wherein the almanac and ephemeris data file describes that satellite that is not yet compiled into the GNSS simulation code.

11. A tangible non-transitory computer readable storage media impressed with computer program instructions that, when executed, simulate new satellite messages for a Global Navigation Satellite System (abbreviated GNSS) simulation, including:

providing a configuration file and a programming script file, neither of which is pre-compiled into a GNSS simulation code, that specify a format of at least one message (a message format) for a satellite and message format combination not yet operational or not yet compiled into the GNSS simulation code;

in preparation for the GNSS simulation, reading and applying the configuration file and running a script from the programming script file to generate navigation data for simulating positioning messages during the GNSS simulation; and using the navigation data for simulating positioning signals during the GNSS simulation and testing of a GNSS receiver against the satellite and message format combination not yet operational or net yet compiled into the GNSS simulation code.

12. The tangible non-transitory computer readable storage media of claim 11, wherein the configuration file is in clear text that is editable using a text editor.

13. The tangible non-transitory computer readable storage media of claim 11, wherein the satellite and message format combination specified in the configuration file and the programming script file is not yet operational because the satellite is not yet operational.

14. The tangible non-transitory computer readable storage media of claim 11, wherein the satellite and message format combination specified in the configuration file and the programming script file is not yet operational because the message format specified is not yet operational.

15. The tangible non-transitory computer readable storage media of claim 11, wherein the satellite and message format combination specified in the configuration file and the programming script file is not yet compiled into the GNSS simulation code.

16. The tangible non-transitory computer readable storage media of claim 11, further including determining the message format and values to use when simulating position signals by combining field format and field data values from a combination of the configuration file, almanac, ephemeris and related data, and the programming script file, including:

determining fields and field formats from the configuration file; and determining values with which to populate the fields, including:

for at least a first field, using a field value specification from the configuration file, for at least a second field, for which there is not a field value specification in the configuration file, using at least almanac and ephemeris data to generate the values, and for at a least third field, for which there is not a field value specification in the configuration file and for which the almanac and ephemeris data are not sufficient to generate the values, identifying a script in the programming script file and using the identified script to generate the values.

17. A system for simulating new satellite messages for a Global Navigation Satellite System (abbreviated GNSS) simulation includes one or more processors coupled to memory, the memory loaded with computer instructions, that when executed on the processors, implement the providing, reading and applying, running, using and testing of claim 11.

18. The system of claim 17, further including determining the message format and values to use when simulating position signals by combining field format and field data values from a combination of the configuration file, almanac, ephemeris and related data, and the programming script file, including:
- determining fields and field formats from the configuration file; and
- determining values with which to populate the fields, including:
  - for at least a first field, using a field value specification from the configuration file,
  - for at least a second field, for which there is not a field value specification in the configuration file, using at least almanac and ephemeris data to generate the values, and
  - for at least a third field, for which there is not a field value specification in the configuration file and for which the almanac and ephemeris data are not sufficient to generate the values, identifying a script in the programming script file and using the identified script to generate the values.

19. The system of claim 18, further including for at least a fourth field, for which there is not a field value specification in the configuration file and for which the almanac, ephemeris and related data are not sufficient to generate the values, and for which there is not a script in the programming script file and using a fill pattern as the values.

20. The system of claim 17, further including providing an almanac and ephemeris data file in clear text that is editable using a text editor and reading the almanac and ephemeris data file to generate navigation data for simulating positioning messages during the GNSS simulation.

* * * * *